US008738346B2

(12) United States Patent
Bolding et al.

(10) Patent No.: US 8,738,346 B2
(45) Date of Patent: May 27, 2014

(54) METHOD AND APPARATUS FOR CONTROLLING MULTIPLE SIMULATIONS

(75) Inventors: Joe D. Bolding, Allen, TX (US); Daniel G. Tormey, Rockwell, TX (US); Ron Gilbert, Jr., Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2222 days.

(21) Appl. No.: 11/586,928

(22) Filed: Oct. 26, 2006

(65) Prior Publication Data

US 2008/0177522 A1    Jul. 24, 2008

(51) Int. Cl.
*G06F 17/50* (2006.01)
(52) U.S. Cl.
USPC ............................................................ 703/13
(58) Field of Classification Search
USPC ............................................................ 703/13
See application file for complete search history.

(56) References Cited

U.S. PATENT DOCUMENTS

| | | | | |
|---|---|---|---|---|
| 6,345,242 | B1 * | 2/2002 | Dearth et al. | 703/22 |
| 6,462,757 | B1 * | 10/2002 | Kao et al. | 715/783 |
| 6,826,675 | B1 | 11/2004 | Tormey | |
| 6,832,181 | B1 | 12/2004 | Bolding et al. | |
| 7,020,722 | B2 * | 3/2006 | Sivier et al. | 709/248 |
| 7,343,566 | B1 * | 3/2008 | Chaudhri et al. | 715/781 |
| 2002/0171682 | A1 * | 11/2002 | Frank et al. | 345/790 |
| 2004/0100480 | A1 * | 5/2004 | Lupu | 345/700 |
| 2004/0102944 | A1 | 5/2004 | Shortz | |
| 2004/0117171 | A1 | 6/2004 | Shortz | |
| 2006/0168538 | A1 * | 7/2006 | Stevens et al. | 715/779 |
| 2007/0180398 | A1 * | 8/2007 | McArdle | 715/781 |

OTHER PUBLICATIONS

Chris Browy et al., "A Guided Tour of SimCluster", Jun. 2004, Avery Design Systems, www.avery-design.info/files/docs/simcluster_sep05_appnotes.pdf, pp. 1-13.*
Ivo Bolsens et al., "Hardware/software co-design of digital telecommunication systems", 1997, Proceedings of the IEEE, vol. 85, No. 3, pp. 391-418.*
Patrick Bohrer et al., "Mambo—a full system simulator for the powerpc architecture", 2004, Sigmetrics Performance Evaluation Review, vol. 31, issue 4, pp. 8-12.*
Kai-Hui Chang et al., "Automatic partitioner for distributed parallel logic simulation", 2004, downloaded from CiteseerX, five unnumbered pages.*
Thomas Zander, Bug #14614, 2000, retrieved from http://markmail.org/message/himzuvbjfzjxvxgv on Mar. 5, 2010, 1 page.*
Anonymous, IconifyAllOtherWindows, 1992, retrieved on Mar. 5, 2010 from http://ftp.andrew.cmu.edu/pub/AUIS/auis-6.3/atk/textaux/gemacscp.help, 5 pages.*
"Minimize all other applications", 2003, retrieved from MrExcel.com on Mar. 5, 2010.*
Eitan Schichmanter, "Minimize All", 2004, retrieved from http://www.mail-archive.com/perl-win32-admin@listserv.activestate.com/msg05124.html on Mar. 5, 2010.*

* cited by examiner

*Primary Examiner* — Kamini S Shah
*Assistant Examiner* — Russ Guill

(57) ABSTRACT

Embodiments include methods, apparatus, and systems for controlling multiple simulations. One embodiment is a method that includes executing plural architectural simulators being interconnected to form a platform for hardware simulation; placing at least one of the plural architectural simulators into a pause state; and automatically minimizing windows associated with the at least one of the plural architectural simulators.

12 Claims, 8 Drawing Sheets

METHOD AND APPARATUS FOR CONTROLLING MULTIPLE SIMULATIONS

BACKGROUND

Architectural simulators are used during the development of new computer platforms to simulate the physical hardware which is being designed. Simulators enable software developers to begin creating programs for the new computer platform even before the hardware development has been completed. Software can be programmed and debugged so that it is ready for release with the completed computer platform. Typically, the software or user code being programmed and tested is executed on the architectural simulator during hardware development. Once the physical hardware has been manufactured, the user code executes on the physical hardware in the same way that it executed on the architectural simulator.

Current simulators often require a user to have numerous xterm windows displayed on a single computer screen. Screens easily become cluttered with many windows. Users can manually click a window to minimize it, but this approach is clumsy and time consuming, especially when numerous windows are simultaneously being displayed.

Often, an interconnection of multiple architectural simulators is required to create a complete simulation of platform. The interaction between different states of the different simulators determines if the complete platform simulation is correct. This interaction, however, is complex and presents problems. For example, if one of the simulators in a simulation stopped and the other simulator were allowed to continue simulating instructions, the simulated time for the stopped simulator would stop (i.e., time is based on instruction execution). At the same time though, time for the running simulator would continue and create a mismatch between these two simulators.

DETAILED DESCRIPTION

Figure 1:
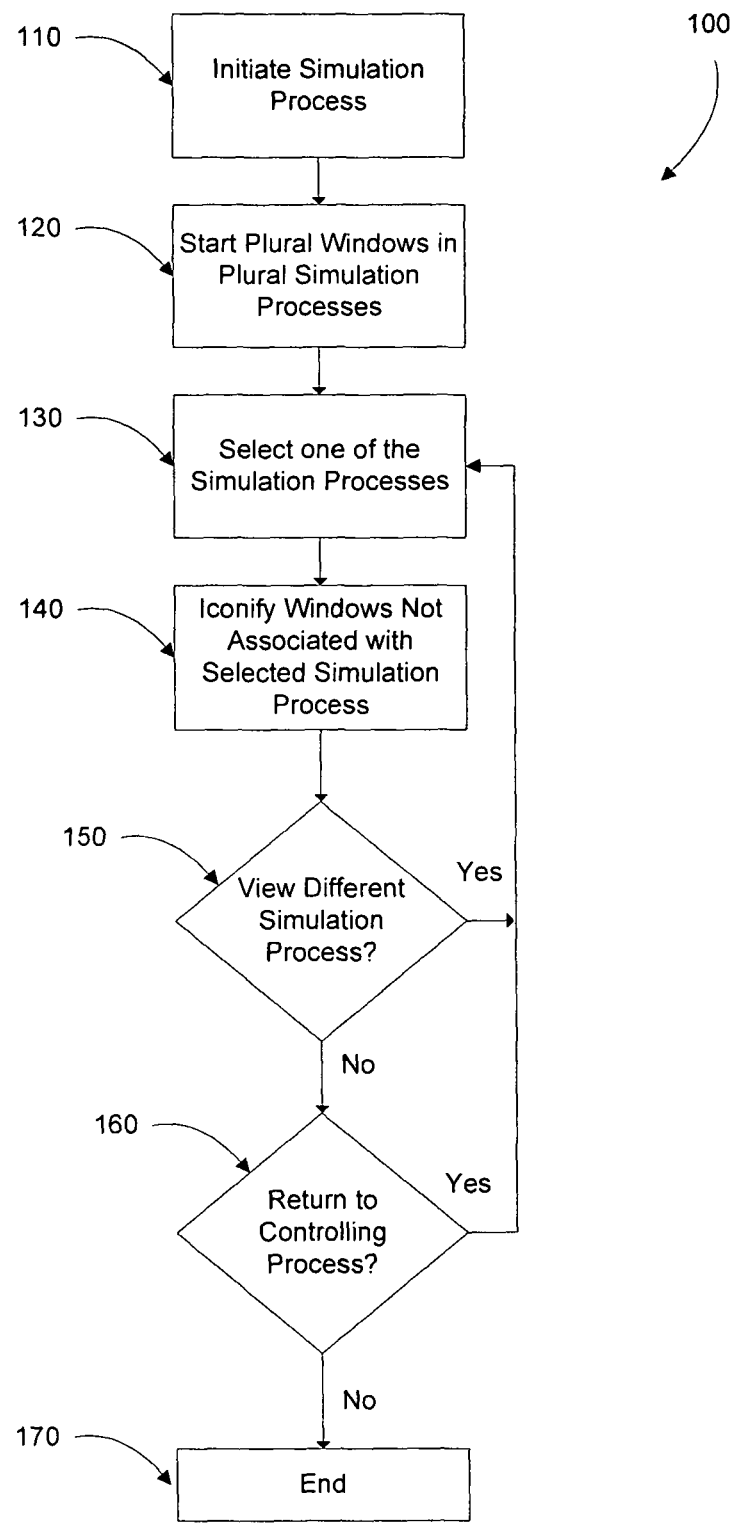
FIG. 1 is flow diagram for controlling multiple windows in plural simulation processes in accordance with an exemplary embodiment of the present invention.

Embodiments in accordance with the present invention are directed to apparatus, systems, and methods for controlling multiple simulations that simultaneously execute. One exemplary embodiment provides a flexible user interface for controlling multiple simulations. Another exemplary embodiment provides methods and apparatus to synchronize and control multiple simulations from a user interface.

One exemplary embodiment provides automatic iconification (example, minimize, reduce, or eliminate from view) and de-iconification (example, maximize, enlarge, or restore) of windows simultaneously executing and being displayed on a screen. For example, windows are minimized and restored based on user selection of one of plural different simulation processes. For example, a simulation model for a large scale system is based on three different processes executing the simulation and a fourth process controlling the simulation. Each simulation has a minimum of three xterm windows associated with the simulation. When a user selects to work with a single process of the simulation, the remaining processes are automatically minimized. This automatic reduction reduces screen clutter and quickly minimizes multiple windows. When a user selects to work with a different process or multiple processes, the minimized processes are automatically restored or maximized. Thus, interaction through a user interface automatically iconifies and de-iconifies windows based on a user selected simulation process. Users are able to select a single or specific simulation among plural simulations. If the user needs to access directly the other simulations, a single command automatically brings-up or restores necessary windows while hiding unused windows.

In another exemplary embodiment, a set of architectural simulators (each with a simulator user interface) are interconnected together to form a complete platform simulation. This exemplary embodiment provides the interconnection of multiple architectural simulators to create a complete simulation of a platform and provides a user interface so a user can control and execute the multiple interconnected simulations. In one exemplary embodiment, a simulation includes three different states: command (CMD), run (RUN), and pause (PAUSE). If the simulator is in the CMD state, then the simulator is waiting for the user to input a command. If the simulator is in the RUN state, then the simulator is simulating processor (example, central processing unit, CPU) instructions and checking for stop requests (such as breakpoints and/or the user typing a Control C). In contrast to the CMD and run states, the PAUSE state is actually stopping the simulation from simulating processor instructions being executed and not allowing any user commands to be entered until released from the PAUSE state by a run command or a Control C. Thus, if a single simulator enters the CMD state, all other simulators are either paused or forced into the CMD state. Here, the complete simulation is coordinated with respect to both time and instructions being executed.

Exemplary embodiments discuss issuing commands (such as a Control C, etc.) into the simulator. Embodiments in accordance with the present invention, though, are not limited to any particular type of command, such as a Control C or other specific command. Specific command types are provided for illustration in describing embodiments.

FIG. 1 shows flow diagram 100 for controlling multiple windows in plural simulation processes in accordance with an exemplary embodiment of the present invention. This exemplary embodiment is discussed in connection with FIGS. 2, 3A, and 3B. Here, three main simulation processes (process 1, process 2, and process 3) and one controlling process (Pm) are disclosed. Each of the simulation processes has three xterm windows provided as (1) information, (2) user control, and (3) console. Exemplary embodiments, however, are not limited to three simulation processes but include fewer processes (such as two processes or one process with multiple windows) and more processes (such as four, five, etc. processes). Further, exemplary embodiments are not limited to three xterm windows but include fewer windows (such as one or two) and more windows (such as three, four, five, etc. windows).

As shown in block 110, the simulation process is initiated or commenced. For example, a user activates the architectural simulation software for a simulation.

Figure 2:
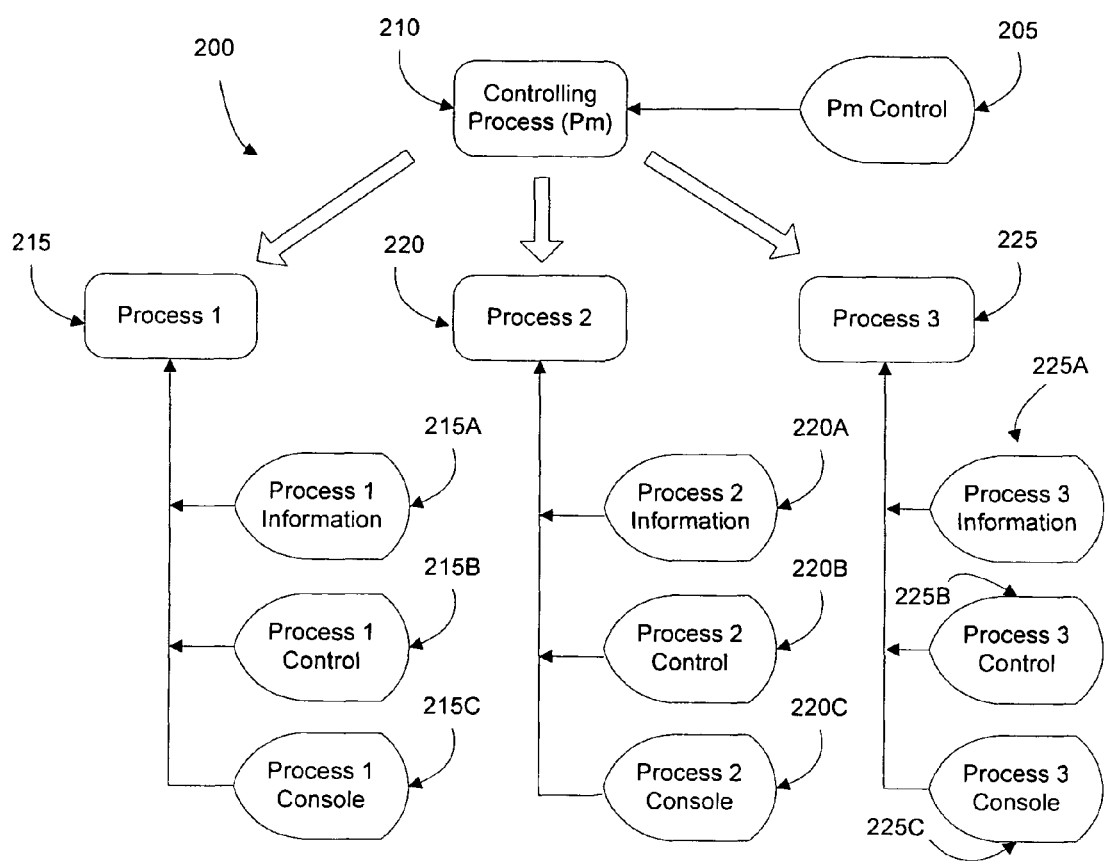
FIG. 2 is a diagram showing control for multiple windows in plural simulation processes in accordance with an exemplary embodiment of the present invention.

FIG. 2 shows a diagram 200 showing control for multiple windows in plural simulation processes in accordance with an exemplary embodiment of the present invention. Here, a Pm control window 205 is in communication with a controlling process (Pm) 210. This controlling process 210 controls three different processes: process 1 (labeled 215), process 2 (labeled 220), and process 3 (labeled 225). Each of these three processes has three xterm windows. Process 1 has an information window 215A, a control window 215B, and a console window 215C. Process 2 has an information window 220A, a control window 220B, and a console window 220C. Process 3 has an information window 225A, a control window 225B, and a console window 225C.

According to block 120, commencement of the simulation process starts plural windows in plural simulation processes. For instance, the user activates controlling process (Pm) 210 via Pm control window 205, and the controlling process 210 in turn starts the simulation processes 215, 220, and 225. By way of example, process 215 is directed to a management processor; process 220 is directed to processor dependent hardware; and process 225 is directed to crossbars, traditional CPU models, etc.

Each of the simulation processes starts three different xterm windows (information, control, and console). By way of example, process 215 initiates information window 215A, control window 215B, and console window 215C. Further, process 220 initiates information window 220A, control window 220B, and console window 220C. Process 225 initiates information window 225A, control window 225B, and console window 225C.

After the controlling process 210 initiates the three processes 215, 220, and 225, ten separate and distinct windows are simultaneously displayed. These ten windows include three different information windows (215A, 220A, and 225A), three different control windows (215B, 220B, 225C), three different console windows (215A, 220B, and 225C), and one Pm control window 205. Each of these ten windows can accept user input.

In one exemplary embodiment, all three processes (215, 220, and 225) are required to be executing to provide a complete simulation. A user, however, may desire to work with only one process at a time. To enable a user to work with a single process (i.e., one of processes 215, 220, and 225), a focus command is used. The focus command enables a user to focus on a single or specific simulation process (i.e., one of processes 215, 220, and 225) while other, non-selected processes run in the background and/or are hidden, minimized, iconified, etc.

According to block 130, a user selects one of the simulation processes. By way of example, a user issues a focus command (example, through interaction with a graphical user interface (GUI) of a display) through the Pm control window 205. The focus command is transmitted to the controlling process 210 which causes all windows not associated with the targeted simulation process to minimize or iconify. Thus, the input of the targeted simulation process is redirected from the user control window to the controlling process window and the user control window is removed. This action is noted in block 140 which indicates to iconify windows not associated with the selected simulation process.

Figure 3A:
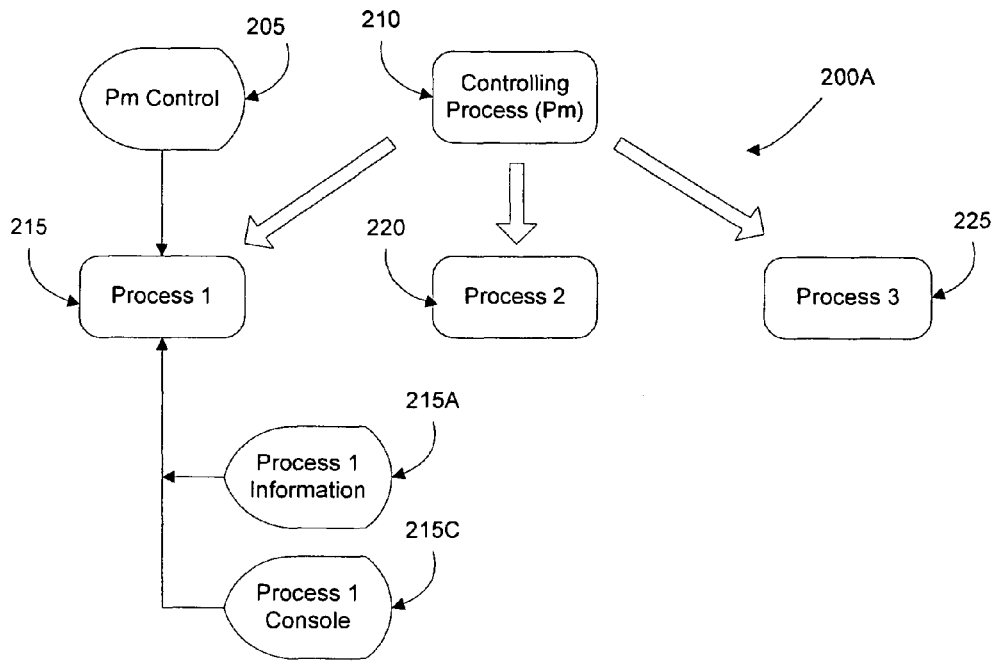
FIG. 3A is a diagram showing selection of a simulation process with other processes being iconified in accordance with an exemplary embodiment of the present invention.

FIG. 3A is a diagram 200A showing selection of a simulation process with other processes being iconified in accordance with an exemplary embodiment of the present invention. By way of example, if a user issues a focus process 1 command (i.e., a command to focus on process 215) from Pm control 205, then the controlling process 210 sends commands to process 220 and process 225 to minimize or iconify their windows. The controlling process 210 then closes the control window 215B and directs the Pm control 205 to control process 215. At this point in time, the user has three visible windows simultaneously appearing on the display: Pm control window 205, information window 215A, and console window 215C. All other windows are iconified, minimized, reduced, or otherwise not present on the display.

According to block 150, a question is asked: View a different simulation process? If the answer to this question is "no" then flow proceeds to block 160. If the answer to this question is "yes" the flow proceeds back to block 130.

Figure 3B:
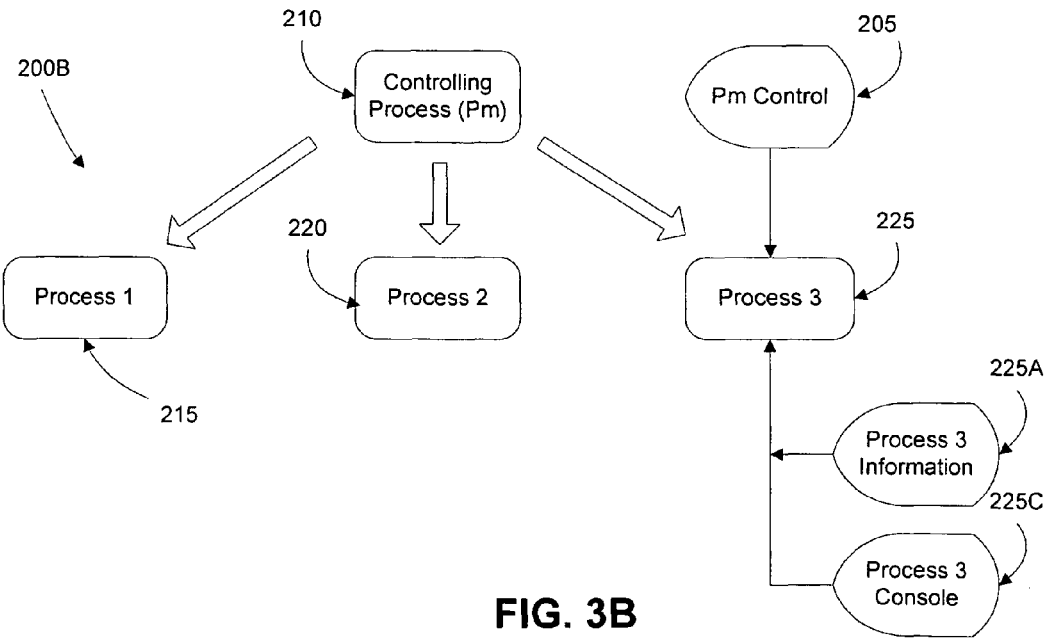
FIG. 3B is another diagram showing selection of a simulation process with other processes being iconified in accordance with an exemplary embodiment of the present invention.

For illustration, assume flow proceeds back to block 130 wherein a user is able to select one of the simulation processes. FIG. 3B is a diagram 200B showing selection of another simulation process with other processes being iconified in accordance with an exemplary embodiment of the present invention. By way of example, if a user issues a focus process 3 command (i.e., a command to focus on process 225) from Pm control 205, then the controlling process 210 sends commands to process 215 and process 220 to minimize or iconify their windows. The controlling process 210 then closes the control window 225B and directs the Pm control 205 to control process 225. At this point in time, the user has three visible windows simultaneously appearing on the display: Pm control window 205, information window 225A, and console window 225C. All other windows are iconified, minimized, reduced, or otherwise not present on the display.

As noted, if the answer to the question in block 150 is "no" then flow proceeds to block 160. Here, a question is asked: Return to controlling process? If the answer to this question is "no" then flow can end. If the answer to this question is "yes" then flow proceeds back to block 130.

By way of further example, if the user issues a "focus pm" command while the pm console 205 is focused on process 215, 220, or 225, then the command is forwarded to the controlling process 210. In turn, the controlling process 210 sends commands to processes 215, 220, and 225 to de-iconify their windows and restore the Pm console input to the controlling process 210 (resulting in the embodiment shown in FIG. 2).

In one exemplary embodiment, multiple architectural simulators (example, processes 1-3 discussed in FIGS. 1-3) are interconnected together to form a complete platform simulation. A user is able to control and execute (example, through interaction with a GUI) the multiple architectural simulators. The user is able to control and execute the simulators with three different states: command (CMD), run (RUN), and pause (PAUSE). If the simulator is in the CMD state, then the simulator is waiting for the user to input a command. If the simulator is in the RUN state, then the simulator is simulating processor (example, central processing unit, CPU) instructions and checking for stop requests (such as breakpoints and/or the user typing a Control C). If the simulator is in the PAUSE state, then the simulator is stopped from simulating processor instructions being executed. In the PAUSE state, user commands are prohibited from being entered until released from the PAUSE state by a run command or a Control C. Thus, if a single simulator enters the CMD state, all other simulators are either paused or forced into the CMD state. Here, the complete simulation is coordinated with respect to both time and instructions being executed.

One exemplary embodiment provides for specific functional use of CMD, RUN, and PAUSE. By way of example, in the CMD state, the simulation allows a user to enter commands that are executed. In one embodiment, the only exit from the CMD state is to the RUN state via the run command. In the RUN state, the simulation is executing simulated instructions (example, simultaneous execution of three processes 1-3 in FIG. 2). Two exits exist from the RUN state: (1) exit to the CMD state, and (2) exit to the PAUSE state. In the PAUSE state, the simulation is paused and is not simulating instructions. In this state, the simulation also does not receive user input. Two exits exist from the PAUSE state: (1) exit to the CMD state, and (2) exit to the RUN state.

In one embodiment, the platform simulation simulators all start in the CMD state. Once in the CMD state, the user can enter commands to any of the simulators in the platform simulation. All commands are executed by the simulation where the command is entered and have no effect on any of the other simulators in the platform simulation with the exception of the run command.

When a simulator receives a user input run command, the simulator generates a run command to all other simulators and enters the RUN state. As a result, all simulators enter the RUN state.

When the simulation is in the RUN state and the user enters a control C, the control C is passed to all other simulations in the platform simulation and all simulators return to the CMD state. This transition can be from the RUN state or the PAUSE state.

When the simulation is in the RUN state and the simulated instruction execution encounters a breakpoint, the state is changed to the CMD state for the simulator that encountered the breakpoint. Further, a pause command is sent to all other simulators resulting in one simulation being in the CMD state and all other simulators being in the PAUSE state.

When a simulator is in the PAUSE state, it needs to receive a Control C request or a run command. If a Control C command is received, the state is changed to CMD. If a run command is received, the state is changed back to RUN and instruction simulation is resumed.

Figure 4:
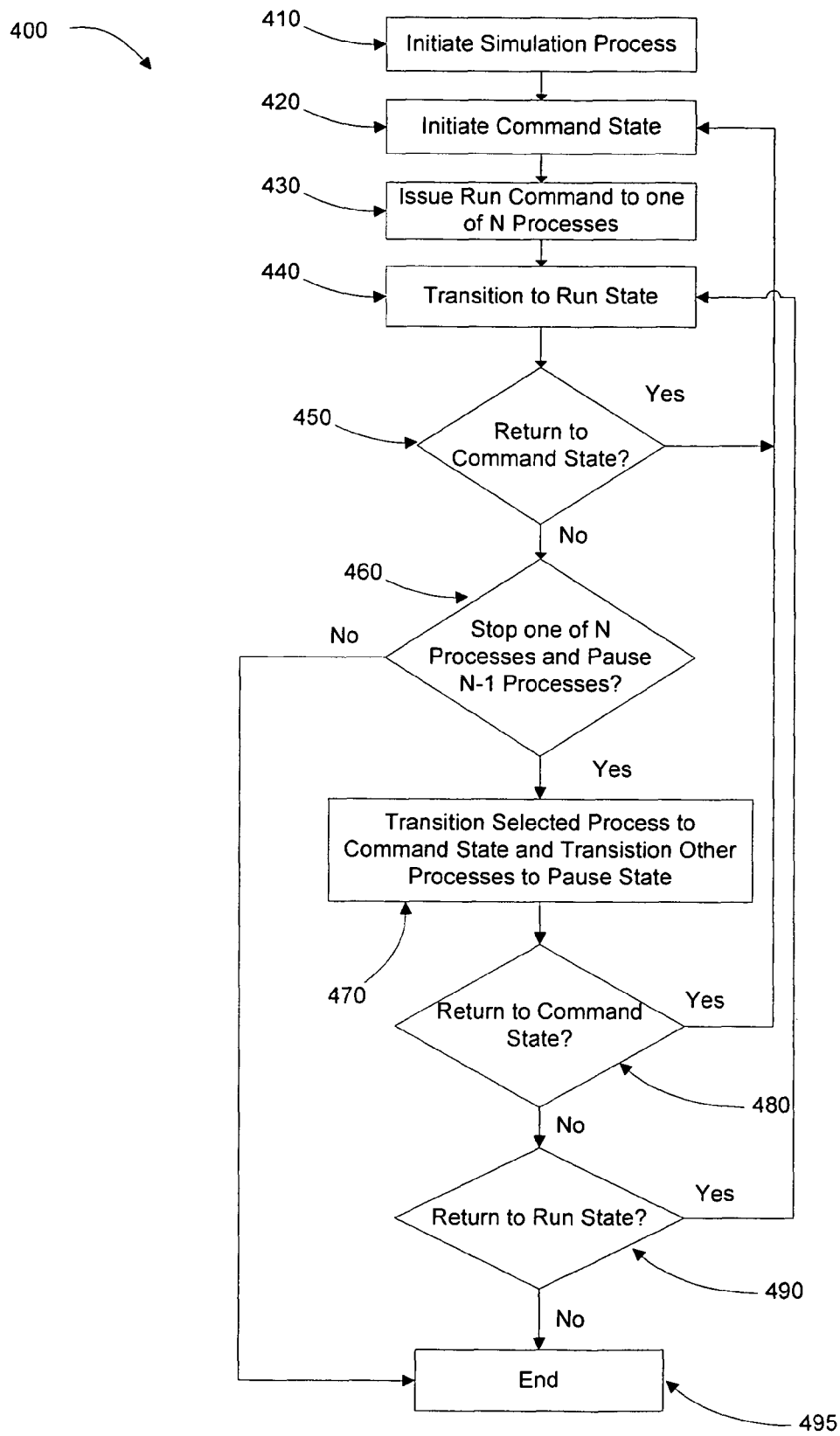
FIG. 4 is a flow diagram for synchronizing and controlling multiple simulations from a user interface in accordance with an exemplary embodiment of the present invention.

FIG. 4 is a flow diagram 400 for synchronizing and controlling multiple simulations from a user interface in accordance with an exemplary embodiment of the present invention. This exemplary embodiment is discussed in connection with FIGS. 5A, 5B, and 5C. Here, three main simulation processes (process 1 at 515, process 2 at 520, and process 3 at 525) and one controlling process (Pm) 510 are disclosed. Interaction with the controlling process 510 is provided through a display and more particularly through a Pm control window 505. Exemplary embodiments, however, are not limited to three simulation processes but include fewer processes (such as two processes or one process with multiple windows) and more processes (such as four, five, etc. processes). Further, exemplary embodiments are not limited to control through any particular interface.

Figure 5A:
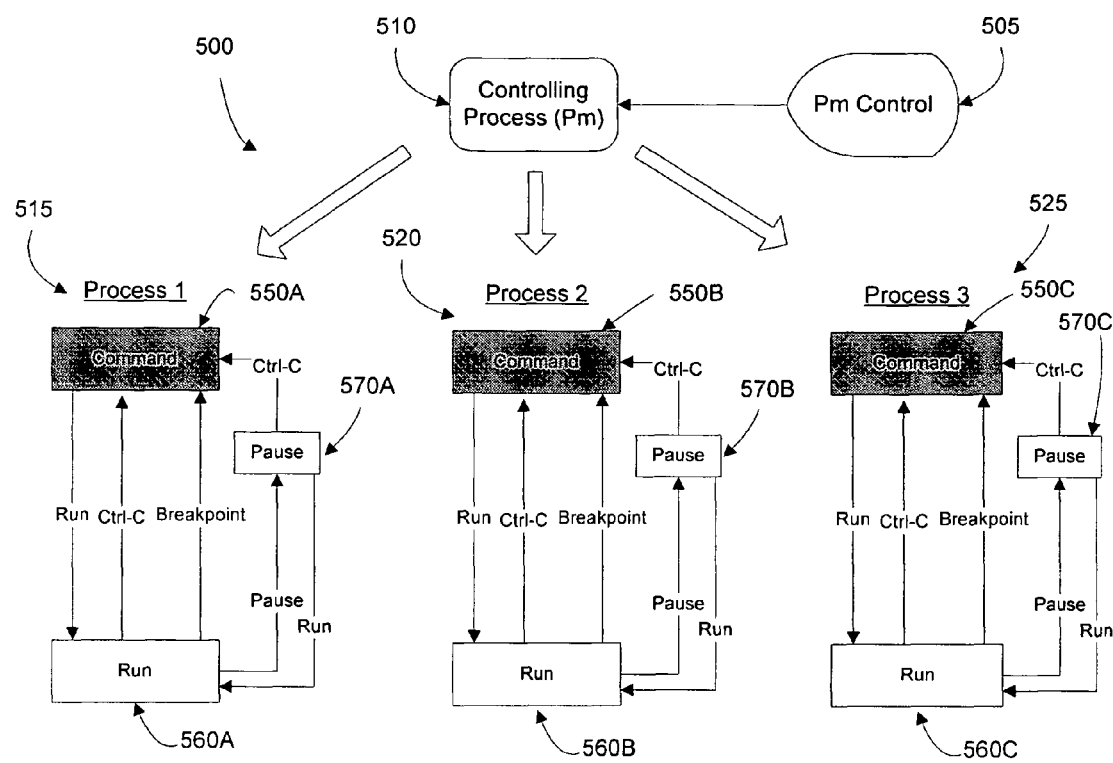
FIG. 5A is a diagram showing multiple processes in a command state in accordance with an exemplary embodiment of the present invention.
Figure 5B:
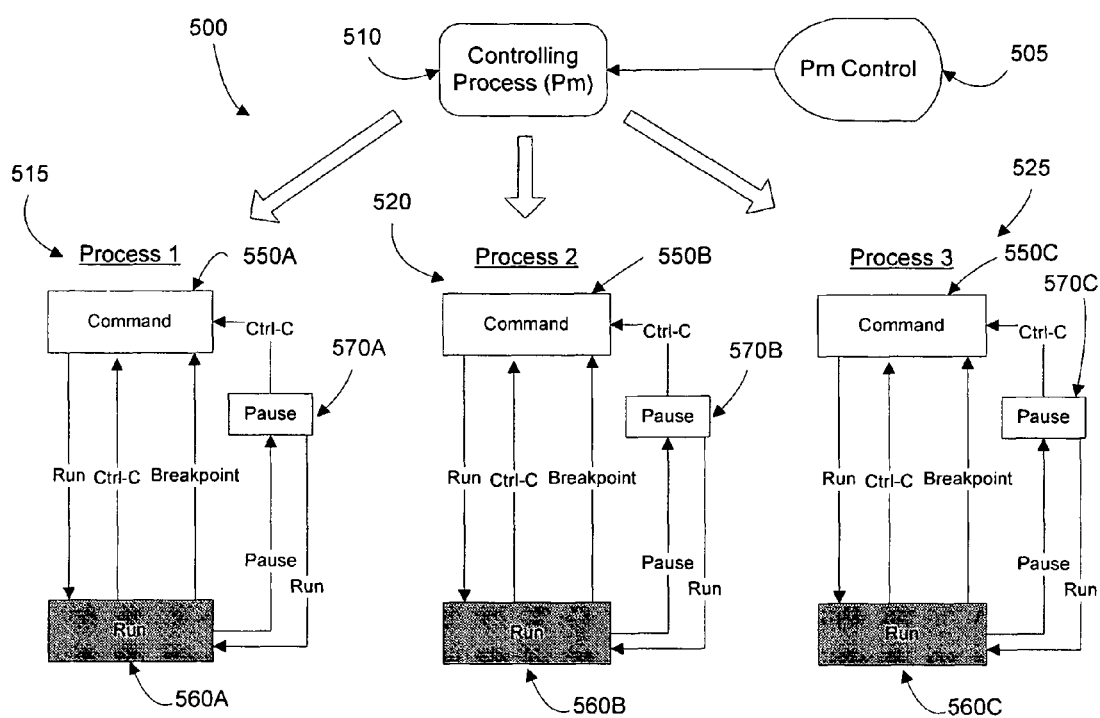
FIG. 5B is a diagram showing multiple processes in a run state in accordance with an exemplary embodiment of the present invention.
Figure 5C:
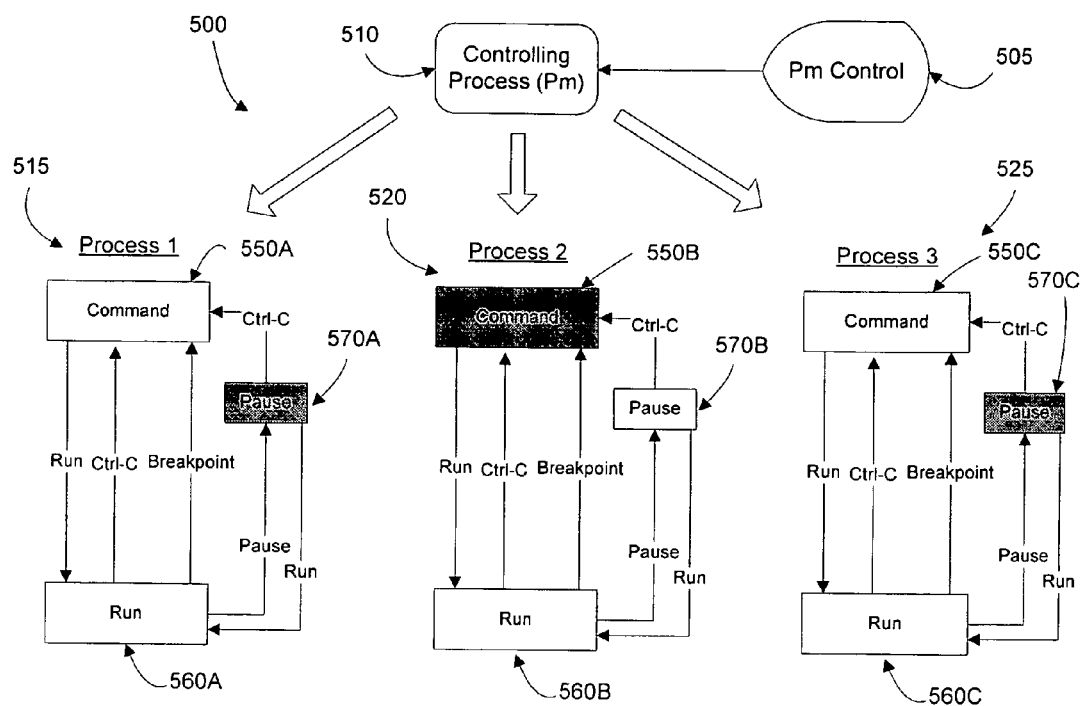
FIG. 5C is a diagram showing multiple processes in a pause state and one process in a command state in accordance with an exemplary embodiment of the present invention.

As shown in FIGS. 5A, 5B, and 5C, each process includes a command state (shown as 550A, 550B, and 550C respectively), a run state (shown as 560A, 560B, and 560C respectively), and a pause state (570A, 570B, and 570C respectively). By way of example, a command state communicates with a run state using each of run commands, Ctrl-C, and breakpoints. The run state communicates with the pause state using both pause and run commands. The pause state communicates with the command state using Ctrl-C.

According to block 410 of FIG. 4, the simulation process is initiated. For example, a user activates the architectural simulation software for a simulation that includes multiple architectural simulators that are interconnected together to form a complete platform simulation.

According to block 420, the command state is initiated. By way of example, FIG. 5A shows each process in the command state. Specifically, process 515 has activated the command state 550A; process 550B has activated the command state 550B; and process 525 has activated the command state 550C.

For discussion purposes, a "State Set" is a linked set of current state diagrams where there is one entry for each of three processes. In alternate embodiments, a state set contains two or more processes rather than the three that are disclosed as exemplary embodiments.

FIGS. 5A, 5B, and 5C thus contain three State Sets. FIG. 5A represents the start state set. All processes start individually in the "command" state (shown as darkened 550A, 550B, and 550C in FIG. 5A).

According to block 430, a run command is issued to one or more of N processes (here, N is shown as being the number three). According to block 440, a transition occurs to the run state (i.e., a transition occurs from FIG. 5A to FIG. 5B).

In one exemplary embodiment, once in the command state, a "RUN" command is issued on any one of the N processes (i.e., to one of process 550A, 550B, and 550C). Once the RUN command is issued to one of the processes, all N processes transition to the run state as indicated in FIG. 5B. Specifically, each of the run states 560A, 560B, and 560C have a darkened box.

From "State Set 2" shown in FIG. 5B, there are two likely events that may occur. The first is that the user might type Control C. This input is representative of any event that causes all N processes to return to the "command" state. In this case, all N processes transition back to the "command" state as shown in "State Set 1" of FIG. 5A. The second event is one that is designed to stop one of the N processes and put the other N−1 processes into the "pause" state. An example of such an event is a "breakpoint" being hit by one process. By way of example, "State Set 3" shown in FIG. 5C represents a situation where process 550B hits a breakpoint. In this state set, process 550B is transitioned to the "command" state and all other processes transition to the "pause" state. In other words, process 550B is in the command state, while process 550A is in pause state 570A and process 550C is in pause state 570C.

Thus, according to block 450, a question is asked: Return to the command state? If the answer is "yes" flow proceeds back to block 420 to initiate the command state. If the answer to this question is "no" then flow proceeds to block 460. Here at block 460, a question is asked: Stop one of the N processes and pause n−1 processes? If the answer to this question is "no" then one option is for flow to end. If the answer to this question is "yes" then flow proceeds to block 470. At block 470, the selected process transitions to the command state while the other, non-selected processes transition to the pause state.

From "State Set 3" shown in FIG. 5c, two likely events can occur. As a first event, a user enters a Control C (example, type ^-C). This step is representative of any event that causes all N process to return to the "command" state. In this case, all N processes transition back to the "command" state "State Set 1" shown in FIG. 5A The second event is the "RUN" command. In this case, all N processes transition to the "run" state "State Set 2" shown in FIG. 5B.

Thus, according to block 480, a question is asked: Return to the command state? If the answer to this question is "yes" the flow proceeds to block 420 wherein the command state is initiated. If the answer to this question is "no" then flow proceeds to block 490.

According to block 490, a question is asked: Return to the run state? If the answer to this question is "yes" then flow proceeds to block 440 wherein a transition occurs to the run state. If the answer to this question is "no" then one possibility is for flow to end at block 495.

Figure 6:
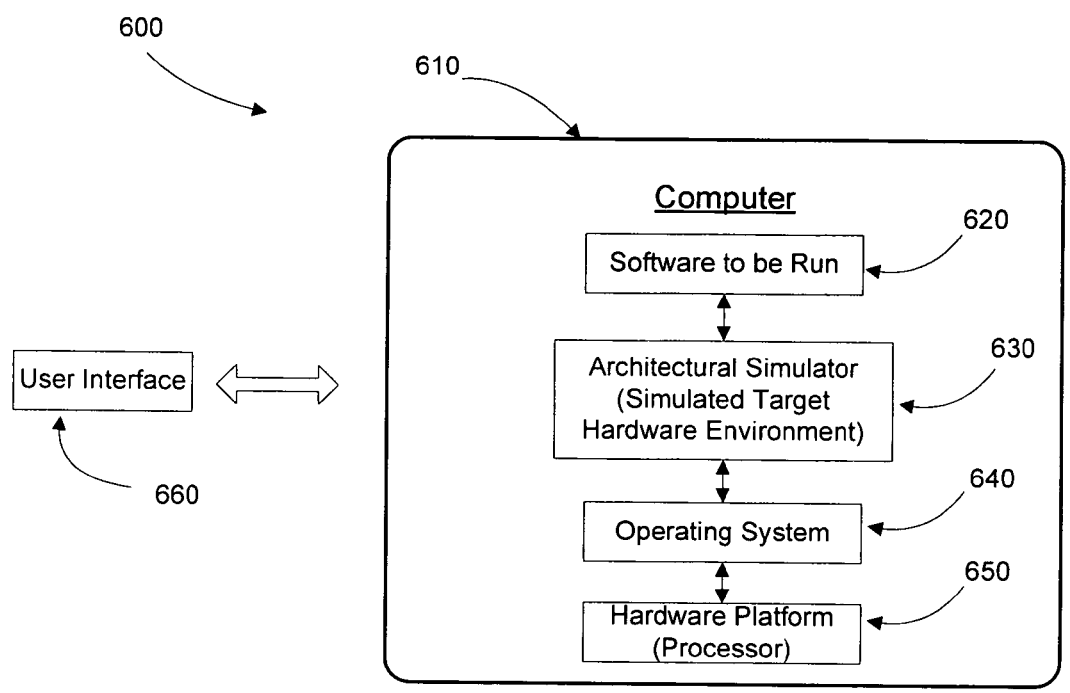
FIG. 6 is a functional block diagram showing a computer with an architectural simulator in accordance with an exemplary embodiment of the present invention.

FIG. 6 illustrates an exemplary system 600 utilizing embodiments in accordance with the invention. The system 600 includes one or more computers 610 (such as host computers or workstations) connected to or in communication with a user interface 660.

Embodiments in accordance with the present invention are not limited to any particular type or number of computers, servers, or computer systems. These devices, for example, include various portable and non-portable computers and/or electronic devices, such as servers, main frame computers, distributed computing devices, laptops, and other electronic devices and systems whether such devices and systems are portable or non-portable. In one exemplary embodiment, the computer includes a processing unit (such as one or more processors or central processing units, CPUs) for controlling the overall operation of memory (such as random access memory (RAM) for temporary data storage and read only memory (ROM) for permanent data storage). The memory stores data, control programs, and applications (such as the architectural simulator).

In one exemplary embodiment, computer 610 includes, has access to, or is in communication with software to be run 620, one or more architectural simulators 630 (example, simulating target hardware environments), an operating system 640, and hardware platform 650 (including at least one processor). By way of example, the hardware platform 650 (which in itself may be comprised of a high performance computing machine) is provided for hosting the architectural simulator application 630. The operating system 640 provides the software platform on top of which the architectural simulator application 630 is executed.

In one exemplary embodiment, a debugger program and other related software/user tools are also integrated with the architectural simulator application 630 that is optimized to simulate a target platform. Program software 620 is intended for execution, optimization, and maintenance is executed on the architectural simulator 630. The user interface 660 is provided for facilitating user interaction with the simulated environment either directly or via an application program interface (API).

As used herein, the term "icon" means a small picture or feature that represents an object or program. Here, an object is any item that can be individually selected and/or manipulated and includes, but is not limited to, shapes and pictures that appear on a display screen and tangible software entities. Here, a program is an organized list of instructions that when executed causes a computer or processor to behave in a predetermined manner. Further, as used herein, an "xterm" is a terminal emulator (i.e., a program that emulates a "dumb" video terminal within another display architecture) for the X window system (i.e., windowing for bitmap displays). The terminal emulator can be equivalent with a command line shell or text terminal and includes remote terminals and graphical interfaces. A terminal emulator inside a GUI is a terminal window.

In one exemplary embodiment, one or more blocks in the flow diagrams are automated. In other words, apparatus, systems, and methods occur automatically. As used herein, the terms "automated" or "automatically" (and like variations thereof) mean controlled operation of an apparatus, system, and/or process using computers and/or mechanical/electrical devices without the necessity of human intervention, observation, effort and/or decision.

The flow diagrams in accordance with exemplary embodiments of the present invention are provided as examples and should not be construed to limit other embodiments within the scope of the invention. For instance, the blocks should not be construed as steps that must proceed in a particular order. Additional blocks/steps may be added, some blocks/steps removed, or the order of the blocks/steps altered and still be within the scope of the invention. Further, blocks within different figures can be added to or exchanged with other blocks in other figures. Further yet, specific numerical data values (such as specific quantities, numbers, categories, etc.) or other specific information should be interpreted as illustrative for discussing exemplary embodiments. Such specific information is not provided to limit the invention.

In the various embodiments in accordance with the present invention, embodiments are implemented as a method, system, and/or apparatus. As one example, exemplary embodiments are implemented as one or more computer software programs to implement the methods described herein. The software is implemented as one or more modules (also referred to as code subroutines, or "objects" in object-oriented programming). The location of the software will differ for the various alternative embodiments. The software programming code, for example, is accessed by a processor or processors of the computer or server from long-term storage media of some type, such as a CD-ROM drive or hard drive. The software programming code is embodied or stored on any of a variety of known media for use with a data processing system or in any memory device such as semiconductor, magnetic and optical devices, including a disk, hard drive, CD-ROM, ROM, etc. The code is distributed on such media, or is distributed to users from the memory or storage of one computer system over a network of some type to other computer systems for use by users of such other systems. Alternatively, the programming code is embodied in the memory (such as memory of the handheld portable electronic device) and accessed by the processor using the bus. The techniques and methods for embodying software programming code in memory, on physical media, and/or distributing software code via networks are well known and will not be further discussed herein.

In one exemplary embodiment, the architectural simulator consists of a computer program, or simulator code, that executes on a computing device. By way of example, the simulator code is executed on a commercially available computer, such as a Unix workstation.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of software execution, comprising:
   executing a hardware simulation process that simultaneously executes plural different simulation processes with each simulation process having plural xterm windows;
   receiving a selection of one of the simulation processes; and
   automatically reducing or hiding xterm windows not associated with the one of the simulation processes in response to receiving the selection of one of the simulation processes.

2. The method of claim 1 further comprising, automatically transforming the xterm windows not associated with the one of the simulation processes into graphical icons.

3. The method of claim 1, wherein each of the plural different simulation processes has a control window, a console window, and an information window.

4. The method of claim 1 further comprising, receiving a focus command from a user that indicates the selection of the one of the simulation processes.

5. The method of claim 1, wherein the plural different simulation processes are interconnected to form a complete platform simulation.

6. The method of claim 1 further comprising:
   generating the selection from user input at a control window simultaneously displayed with the plural xterm windows;
   transmitting the selection to a control process that controls the windows not associated with the one of the simulation processes.

7. The method of claim 1 further comprising:
   iconifying the xterm windows not associated with the one of the simulation processes;
   redirecting input of the one of the simulation processes from a user control window to a window that controls the simulation process;
   removing the user control window.

8. A method executed by a computer, comprising:
   executing a hardware simulation process that simultaneously executes a first simulation process having an xterm window and a second simulation process having an xterm window;
   simultaneously displaying the xterm window of the first simulation process and the xterm window of the second simulation process;
   selecting to work with the first simulation process; and
   automatically minimizing display of the xterm window of the second simulation process upon selecting to work with the first simulation process.

9. The method of claim 8, wherein the first and the second simulations processes each has three xterm windows that include an information window, a control window, and a console window, and selection to work with the first simulation process automatically minimizes display of the information window, the control window, and the console window of the second simulation process.

10. The method of claim 8 further comprising, running the second simulation in a background while the xterm window of the second simulation is minimized.

11. The method of claim 8 further comprising, receiving a focus command from a graphical user interface that indicates selection to work with the first simulation process.

12. The method of claim 8 further comprising:
   generating a selection to work with the first simulation process from input at a control window simultaneously displayed with the xterm window of the first simulation process and the xterm window of the second simulation process;
   transmitting the selection to a control process that minimizes display of windows not associated with the first simulation processes.

* * * * *